United States Patent [19]

Lanz

[11] 4,063,165

[45] Dec. 13, 1977

[54] APPARATUS FOR LOCALIZATION OF A LINE FAULT BY USING TRAVELING WAVE SIGNALS ESPECIALLY FOR LOCATING FAULTS BOTH NEAR AND FAR FROM A MEASURING LOCATION

[75] Inventor: Otto Lanz, Niederrohrdorf, Switzerland

[73] Assignee: BBC Brown Boveri & Company Limited, Baden, Switzerland

[21] Appl. No.: 690,611

[22] Filed: May 27, 1976

[30] Foreign Application Priority Data

June 6, 1975 Switzerland ................. 7347/75

[51] Int. Cl.² .......................................... G01R 31/08
[52] U.S. Cl. ................................................... 324/52
[58] Field of Search ................. 324/51, 52; 317/36 D; 179/175.3 F

[56] References Cited

U.S. PATENT DOCUMENTS

| | | | |
|---|---|---|---|
| 3,281,673 | 10/1966 | Richardson | 324/52 |
| 3,590,368 | 6/1971 | Esclangon | 324/51 |
| 3,612,989 | 10/1971 | Souillard et al. | 324/52 |
| 3,670,240 | 6/1972 | Maranchak et al. | 324/52 |
| 3,723,864 | 3/1973 | Ricard | 324/52 |
| 3,800,215 | 3/1974 | Souillard | 324/52 |
| 3,878,460 | 4/1975 | Nimmersjo | 324/52 |
| 3,931,502 | 1/1976 | Kohlas | 324/52 X |
| 3,983,377 | 9/1976 | Vitins | 324/52 X |

Primary Examiner—Gerard R. Strecker
Attorney, Agent, or Firm—Werner W. Kleeman

[57] ABSTRACT

An apparatus for localization of a line fault wherein at a measuring location on the line there is provided a voltage- and current-measurement circuit, the outputs of which carry a number of voltage-current signal pairs independent of one another with respect to the line inductances and line capacitances. A summation circuit having at least two outputs is connected with the measurement circuit through the agency of at least one voltage- and one current signal channel. In the summation circuit there are additively and subtractively superimposed at least one pair of mutually independent voltage- and current signals, if necessary after multiplication of at least one of these signals by a constant factor, into traveling wave signals associated with oppositely moving traveling waves, these traveling wave signals appearing at corresponding outputs of the summation circuit. An integration circuit forms time integrals of the traveling wave signals and an evaluation circuit links or processes at least two traveling wave-time integrals into an evaluation function characterizing the fault direction and/or the fault distance from the measuring location or at least a predetermined reference location on the line. The voltage signal channel encompasses two parallel branches, one of which comprises an oscillating circuit having a natural frequency contained in the fault-free line voltage.

7 Claims, 2 Drawing Figures

APPARATUS FOR LOCALIZATION OF A LINE FAULT BY USING TRAVELING WAVE SIGNALS ESPECIALLY FOR LOCATING FAULTS BOTH NEAR AND FAR FROM A MEASURING LOCATION

BACKGROUND OF THE INVENTION

The present invention relates to a new and improved construction of apparatus for localization of a line fault in which there is formed from the voltage and current at a measuring or test location at least one signal (traveling wave signal) associated with a traveling wave on the line and its variation as a function of time at the measuring location.

In particular the instant invention is an improvement upon that disclosed in the commonly assigned, copending United States application of Otto Lanz and Michael Vitins, filed Apr. 14, 1976, Ser. No. 676,983, entitled "Method And Apparatus For Locating A Fault On A Line" and the disclosure of which is incorporated herein by reference. While the instant invention can be beneficially used with the therein disclosed circuitry it can be also employed with other equipment for fault location localization operating with traveling waves.

In the just-mentioned copending application there is disclosed an apparatus for locating a fault, i.e. for determining the direction and/or distance of a fault location with respect to a measuring location on a line, with the aid of so-called traveling wave signals. In this context there is to be understood the temporal progression or variation as a function of time at the measuring location of a traveling wave which propagates through the line in the one or the other direction. The apparatus functions with pairs of oppositely moving traveling wave signals, i.e. traveling wave signals which are associated with oppositely moving traveling waves on the line.

These traveling wave signals are formed from measurement signals corresponding to the temporal progression i.e. the course as a function of time of the voltage and current at the measuring location. These signals are hereinafter briefly referred to as the measurement voltage and measurement current respectively. Formation of the traveling wave signals is carried out by additively and subtractively superimposing and measurement voltage and the measurement current, and generally the measurement current or also the measurement voltage is multiplied by a factor.

In particular it is here assumed in the disclosure to follow that the measurement current is directly multiplied by a factor having the significance of an impedance, but with suitable standardization of the magnitudes of the traveling wave signals there can be also utilized multiplication of the measurement voltage by a factor which then has the significance of the reciprocal impedance.

Furthermore, there is always required a pair of measurement voltages and measurement currents which, in consideration of the line inductances and line capacitances, are independent of other voltages and currents respectively. This condition is fulfilled anyway in the case of an aboveground single-line system which is not affected by other lines. In a multi-conductor system there is to be detected for each line a voltage-current signal pair at the measuring or test station, and from which there are to be formed by means of conventional modal resolution appropriate fictitious and mutually decoupled i.e. independent voltage-current signal pairs. From the latter there is then formed by suitable linear combination with the elements of modal matrices, which can be definitely calculated from the given partial inductances and partial capacitances of the conductor system, oppositely moving traveling wave signal pairs for the fault location determination.

In the description to follow for the sake of simplicity reference will be made to a single-conductor system.

The apparatus disclosed in the aforementioned copending application for the fault location determination functions in a faultless manner as long as the measurement voltage in the presence of a short-circuit does not breakdown to too low values, i.e. as far as the measuring location is concerned the fault location positions are not too close. For near faults having correspondingly intense voltage breakdown there are however present difficulties due to the measurement voltage amplitude approaching the disturbance or interfering signal peak following the short-circuit.

SUMMARY OF THE INVENTION

It is a primary object of the present invention to improve upon the aforementioned apparatus in a manner that there also can be detected near or close faults with sufficient accuracy at least with respect to their direction related to the measuring location.

The inventive apparatus for localization of a line fault, wherein there is formed at least one signal (traveling wave signal) from the voltage and current at a measuring location and associated with a traveling wave on the line and the course as a function of time thereof at the measuring location, comprises the features of:

a. a voltage- and current-measurement circuit at the measuring location on the line, the outputs of which carry a number of voltage-current signal pairs independent of one another with respect to the line inductances and line capacitances and corresponding to the number of phases or conductors of the line;

b. a summation circuit having at least two outputs and connected via at least one voltage- and one current signal channel with the measurement circuit, in the summation circuit there are additively and subtractively superimposed at least one pair of mutually independent voltage and current signals, if necessary after multiplication of at least one of these signals by a constant factor, into traveling wave signals associated with oppositely moving traveling waves, these traveling wave signals appearing at corresponding outputs of the summation circuit;

c. an integration circuit for the formation of time integrals of the traveling wave signals;

d. an evaluation circuit for linking or processing at least two traveling wave-time integrals into an evaluation function characterizing the fault direction and/or the fault distance from the measuring location or at least a predetermined reference location on the line;

e. the voltage signal channel comprising two parallel branches superimposed at the output side, one of which comprises an oscillating circuit having a natural frequency containing in the fault-free line voltage.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE INVENTION

Figure 1:
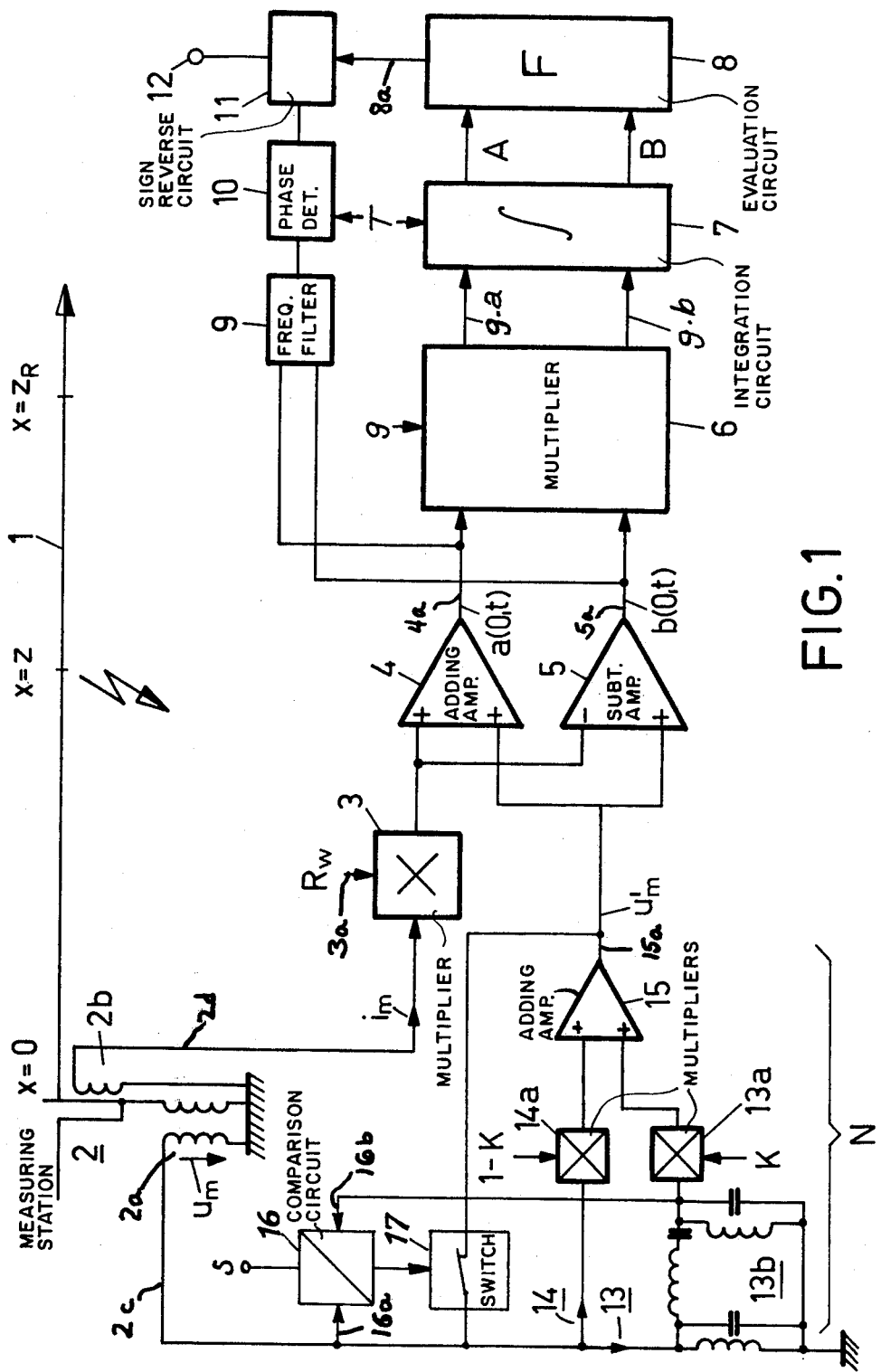
FIG. 1 is a block circuit diagram of apparatus for localization of a line fault according to the invention.

Describing now the drawings, in FIG. 1 there is shown a line composed of an above-ground conductor 1 having the longitudinal coordinate $x$ and the measuring or test location $x = 0$ and a predetermined reference location $x = z_R$ and a fault location $x = z$ assumed to be located therebetween. At the measuring location there is a measurement station 2 with a measurement voltage converter 2a and a measurement current converter 2b. Connected therewith is a measurement voltage channel 2c containing the measurement voltage $u_m$ and a measurement current channel 2d containing the measurement current $i_m$. The measurement voltage channel 2c is connected via a near fault-compensation device N and the measurement current channel 2d via a constant factor multiplier 3 having a second input 3a for the infeed of an impedance factor $R_w$ with a summation circuit composed of a summing or adding amplifier 4 and a subtraction amplifier 5. An the output 4a of the adding amplifier 4 there thus appears a first traveling wave signal $$(1) \quad a(0,t) = u_m + R_w \cdot i_m, \text{ and}$$

at the output 5a of the substraction amplifier 5 a second traveling wave signal $$(2) \quad b(0,t) = -u_m + R_w \cdot i_m.$$

These traveling wave signals, as described in detail in the aforementioned copending application, are multiplied in a multiplication circuit or multiplier 6 for instance with one, if necessary also with a number of different, for instance time-shifted weighting functions $g(t)$. There follows an integration circuit 7 having for instance defined integration intervals which are determined by means of a suitable control input T. At the output of the integration circuit 7 there appear at least two time integrals A and B which —with the aid of an additional circuit for the determination of the phase position of the integration intervals relative to a fundamental oscillation, for instance the network frequency component of the traveling wave signals —already renders possible a fault direction- and fault distance determination relative to the measuring location, and specifically by the processing or linking operation disclosed in the copending application of the time integrals into an evaluation function F in a linking or evaluation circuit 8. For the aforementioned phase determination there is provided an auxiliary branch leading from the output side of the summation circuit 4, 5 and containing a frequency filter 9 for accentuating the traveling wave-fundamental frequency components and a phase detector 10. The latter determines the phase position of the integration intervals relative to the fundamental oscillation components of the traveling wave signals and accordingly there is possibly corrected the sign of the evaluation function by means of a sign reversing circuit 11 connected after 8a of the linking or evaluation circuit 8. At the terminal output 12 of the circuit there thus appears the correct sign corresponding to the fault direction with respect to the measuring or test location.

Moreover, by the time displacement of the oppositely moving traveling wave signals relative to one another, by weighting with weighting functions shifted as a function of time relative to one another or by integration of the possibly weighted oppositely moving traveling wave signals over mutually shifted integration intervals there can be determined a reference location on the line with respect to which then there can be undertaken a fault direction- and/or fault distance determination.

The near or close fault-compensation circuit N in the measurement voltage channel 2c comprises a branched arrangement of two parallel channels 13 and 14. The first channel 13 embodies an oscillating circuit 13b — here for instance a bandpass filter tuned to the network frequency and having a number of inductive and capacitive energy storages. Through the intermediary of a respective constant factor multiplier 13a and 14a body of the parallel channels 13 and 14 are superimposed by means of an adding or summing amplifier 15, at the output 15a of which appears the corrected measurement voltage $u'_m$ for the previously mentioned further processing.

Both of the multipliers 13a and 14a are adjusted to the respective factors K and 1 − K which are complementary with respect to the value 1, so that in the steady state after occurrence of the fault, where the superimposed tangent upper harmonics of the voltage caused by the short-circuit have decayed, there is essentially valid $u_m = u'_m$. With suitable magnitude standardization of the measurement voltage, which can be achieved by appropriate factors in the measurement current channel and if necessary by appropriate accommodations carried out in the evaluation circuit, each different constant factor multiplication in both parallel channels is satisfactory, so that if necessary, there can be dispensed with at least one of both multipliers 13a or 14a respectively. In a concrete circuit example there is of course to be insured by means of a suitable summing resistor in the branch channel 14 for the subsequent additive superimposing of both branch signals.

Furthermore, according to the showing of FIG. 1 there is provided a comparison circuit 16, the inputs 16a and 16b of which are controlled by the measurement voltage $u_m$ and by the output signal of the oscillating circuit 13b. Upon dropping of the original measurement voltage below the quasi-stationary measurement voltage transmitted by the oscillating circuit, and specifically upon falling below an adjustable difference value s, the comparison circuit 16 opens a break contact or switch 17 bridging the entire branch containing the parallel channels 13 and 14. In this way there is completed the transition of the traveling wave signal-formation with the original measurement voltage $u_m$ to the previously described traveling wave signal-formation with the corrected measurement voltage $u'_m$.

Since the degree of dropping of the measurement voltage is dependent upon the measuring location-fault location distance z, this switching operation corresponds to a certain fault location position which distinguishes near faults and remote faults. A validity or truth criterion for the near fault signal or remote fault signal can be moreover also derived in a different manner from the approximate fault location position, for instance also by comparison of the measurement voltage with a constant reference magnitude. The indicated comparison with the quasi-stationary transmitted measurement voltage has the advantage however that there is automatically taken into account fluctuations of the line voltage during normal operation.

Figure 2:
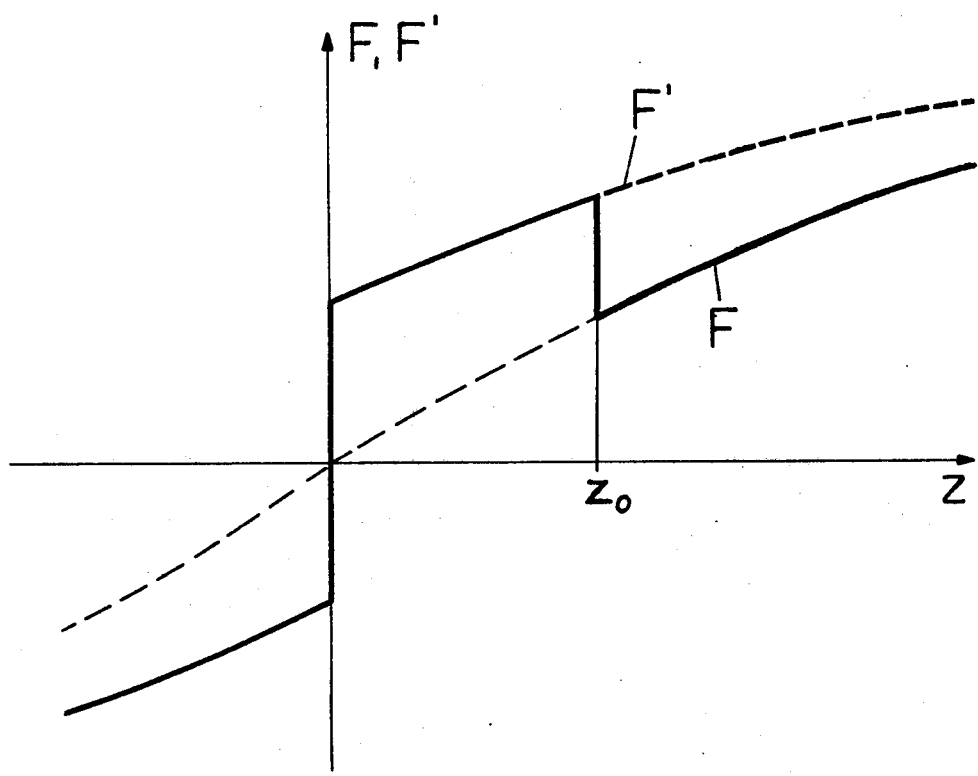
FIG. 2 is a curve portraying the course of the distance- and direction-dependent evaluation functions with respect to the fault location from the test location.

While referring to FIG. 2 the mode of operation will be further considered and is as follows:

The curve F shows the course of the evaluation function obtained with the original measurement voltage $u_m$, the curve F' that of the evaluation function obtained with the corrected measurement voltage $u'_m$ over the measuring location-fault location distance z. These are thus calibration curves of the fault location. Due to the null crossover with finite ascent the curve F at this region in consideration of the disturbance signal peak is associated with an uncertainty not only for the distance determination but especially also for the direction determination, thus rendering questionable the utility of the apparatus. The curve F' on the other hand exhibits at the null crossover region a jump-like course having a step height which exceeds in a positive manner the disturbance signal peak and thus renders possible a positive direction determination or decision. Additionally, the magnitude distortion of the evaluation function due to the near fault compensation is clearly dependent upon the measuring location-fault location distance, so that there is also possible with suitable calibration a fault distance determination in the near fault region.

What is decisive for this effect is the quasi-stationary further transmission of the measurement voltage by the compensation oscillation arising upon the presence of a short-circuit with voltage breakdown at the measuring location, the compensation oscillation having a natural frequency of the oscillating circuit tuned to the fundamental frequency, in this case the network frequency. In the case of remotely located faults on the other hand the use of the original evaluation function is more advantageous, among other things, due to the simple employment of reference locations as above explained. For a certain fault location $z_o$ at a minimum distance from the measuring location there thus automatically occurs the previously discussed switching between the corrected and the original measurement voltage.

The total calibration curve is composed of two sections having different scales. The correlation of the determined value of the evaluation function to one or the other regions can be readily derived for instance from the output signal of the comparison circuit 16 of FIG. 1.

A notable advantage resides in the fact that the influence of the measurement voltage distortion due to the oscillating circuit is eliminated owing to the complementary factor adjustment in the steady state and relatively decreases with the measuring location-fault location distance.

Finally, it is to be mentioned that the transmission of the measurement voltage, apart from the indicated circuit means, also can be carried out with other devices capable of oscillating, for instance by means of active filter circuits, oscillators having a phase regulation circuit for the synchronization with the network frequency, electroacoustical delay elements and the like.

While there are shown and described present preferred embodiments of the invention, it is to be distinctly understood that the invention is not limited thereto, but may be otherwise variously embodied and practiced within the scope of the following claims.

ACCORDINGLY,

What I claimed is:

1. An apparatus for localization of a line fault wherein there is formed at least one signal (traveling wave signal) from the voltage and current at a measuring location and associated with a traveling wave on the line and its variation as a function of time at the measuring location, said apparatus comprising the combination of:
   a. a voltage- and current-measuring circuit provided at the measuring location on the line, said voltage- and current-measuring circuit having outputs which carry a number of voltage-current signal pairs independent of one another with respect to the line inductances and line capacitances and corresponding to the number of phases or conductors of the line;
   b. a summation circuit having at least two outputs;
   c. the summation circuit being connected via at least one voltage signal channel and one current signal channel with the measuring circuit, said summation circuit additively and subtractively superimposing at least one pair of mutually independent voltage and current signals into traveling wave signals related to oppositely moving traveling waves, said traveling wave signals appearing at the outputs of the summation circuit;
   d. an integration circuit for the formation of time integrals of the traveling wave signals;
   e. an evaluation circuit for processing at least two traveling wave-time integrals into an evaluation function selectively characterizing at least any one of the (i) fault direction, (ii) the fault distance from the measuring location, (iii) both the fault direction and fault distance from the measuring location, or (iv) at least a predetermined reference location on the line;
   f. said voltage signal channel comprising two parallel branches, one of said parallel branches comprises an oscillating circuit having a natural frequency contained in the fault-free line voltage.

2. The apparatus as defined in claim 1, wherein the measuring circuit serves to multiply at least one of the mutually independent voltage and current signals by a constant factor.

3. The apparatus as defined in claim 1, further including means for superimposing the parallel branches at their output side.

4. The apparatus as defined in claim 1, wherein the oscillating circuit comprises a bandpass filter tuned at least approximately to the network frequency of the line.

5. The apparatus as defined in claim 1, wherein a constant factor multiplier is provided in at least one of said two parallel branches of the voltage signal channel.

6. The apparatus as defined in claim 5, wherein a constant factor multiplier is provided in each of said two parallel branches and the factors of these two multipliers additively complement one another at least approximately to the value one.

7. The apparatus as defined in claim 1, further including switching means in circuit with said parallel branches for activating near fault compensation in accordance with a validity criterion which is dependent upon the measuring location-fault location distance.

* * * * *